United States Patent
Chung

(10) Patent No.: US 7,023,266 B2
(45) Date of Patent: Apr. 4, 2006

(54) DEVICE AND METHOD FOR NULLIFYING OFFSET VOLTAGES IN OPERATIONAL AMPLIFIERS

(75) Inventor: Kyu Young Chung, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/853,421

(22) Filed: May 25, 2004

(65) Prior Publication Data

US 2005/0168278 A1   Aug. 4, 2005

(30) Foreign Application Priority Data

Jan. 29, 2004   (KR) .................... 10-2004-0005642

(51) Int. Cl.
*H03F 1/02*  (2006.01)
(52) U.S. Cl. .......................... 330/9; 330/260
(58) Field of Classification Search .............. 330/9, 330/260, 310; 327/124, 307
See application file for complete search history.

(56) References Cited

U.S. PATENT DOCUMENTS 5,508,656 A * 4/1996 Jaffard et al. ................ 330/9
5,793,243 A * 8/1998 Farrow ........................ 327/345
5,926,066 A * 7/1999 Sauer ............................ 330/9

FOREIGN PATENT DOCUMENTS

JP          08-250939        9/1996
KR       P1999-0039084       6/1999

* cited by examiner

*Primary Examiner*—Henry Choe
(74) *Attorney, Agent, or Firm*—F. Chau & Associates, LLC

(57) ABSTRACT

A device and method for nullifying an offset voltage in an operational amplifier, the operational amplifier having a first input, a second input, an output, and a first resistor connected between the output and the first input, the device comprising: an adjustable resistor electrically connected to the first resistor, forming a first resistor network having a first feedback ratio at the first input of the operational amplifier; a comparator having a first input and a second input, the first input electrically connected to the output of the operational amplifier through a second resistor; a third resistor connected to the second resistor, forming a second resistor network having a second feedback ratio at the first input of the comparator; and an offset measurer electrically connected to the comparator and the adjustable resistor for measuring an output value of the comparator and for adjusting the adjustable resistor based on the measured output value.

39 Claims, 9 Drawing Sheets

FIG. 10

$V_{COM} = 0$ ↕

$V_{COM} = 1$ ↕

```
0 0 0 0 0 0 0 0
0 0 0 0 0 0 0 1
0 0 0 0 0 0 1 1
0 0 0 0 0 1 1 1
0 0 0 0 1 1 1 1    ← INITIAL VALUE
0 0 0 1 1 1 1 1
0 0 1 1 1 1 1 1
0 1 1 1 1 1 1 1
1 1 1 1 1 1 1 1
```

DEVICE AND METHOD FOR NULLIFYING OFFSET VOLTAGES IN OPERATIONAL AMPLIFIERS

TECHNICAL FIELD

The present invention is directed to a device and a method for use with an operational amplifier; more particularly, a device and a method for nullifying an offset voltage in an operational amplifier.

DISCUSSION OF RELATED ART

Operational amplifiers are devices which have been widely used for amplification of signals. Operational amplifiers can be connected for usage as signal amplifiers or as signal attenuators. FIG. 1A shows an operational amplifier connected for signal amplification, known as a non-inverting amplifier. The voltages for the non-inverting amplifier can be expressed as $V_{out1}=((R2/R1)+1)V_{IN1}$ wherein the amplification gain is $1+(R2/R1)$. FIG. 1B shows an inverting amplifier which can be used to attenuate an input signal because the signal at the output of the amplifier has a negative polarity as compared to the signal at the input of the amplifier. The voltages of the inverting amplifier can be expressed as $V_{out2}=-(R2/R1)V_{IN2}$. In both cases, the voltage present at the output of the operational amplifier is the voltage that is present between the two input terminals of the operational amplifier multiplied by the gain. Thus, if there is any stray or offset voltage $V_{OFF}$ other than the input voltage present between the two input terminals of the operational amplifier, the output voltage of the operational amplifier will have the amplified version of the input voltage as expressed above, plus an error voltage equal to $V_{OFF}$ multiplied by the gain. Whether the operational amplifier is used for amplification or attenuation of signals, the amplified or attenuated signal will be distorted by the amplified offset voltage.

A need therefore exists for a device and method for nullifying the effect of the offset voltage that is present at the input of the operational amplifier.

SUMMARY OF THE INVENTION

According to an embodiment of the present invention, a device for nullifying an offset voltage in an operational amplifier is provided, the operational amplifier having a first input, a second input, an output, and a first resistor connected between the output and the first input, the device comprising: an adjustable resistor electrically connected to the first resistor, forming a first resistor network having a first feedback ratio at the first input of the operational amplifier; a comparator having a first input and a second input, the first input electrically connected to the output of the operational amplifier through a second resistor; a third resistor connected to the second resistor, forming a second resistor network having a second feedback ratio at the first input of the comparator; and an offset measurer electrically connected between the comparator and the adjustable resistor for measuring an output value of the comparator and for adjusting the adjustable resistor based on the measured output value, wherein the first feedback ratio and the second feedback ratio are the same.

The device including an enable signal node for receiving an enable signal for selectively connecting the second resistor network to the operational amplifier and enabling the offset measurer. Preferably, the adjustable resistor is set at an initial value corresponding to a zero offset voltage when the enable signal is inactive. The offset measurer may be a counter, wherein the counter counts up in value when the comparator outputs a first logic value and counts down in value when the comparator outputs a second logic value and the adjustable resistor is adjustably increased and decreased proportionally to the counter value.

The device further including an averaging circuit for averaging the values output from the offset measurer, wherein the output of the averaging circuit is used to adjust the adjustable resistor to a value corresponding to zero offset, wherein the averaging circuit includes a first latch, a second latch, and an adder, the first latch for storing the output of the offset measurer when the comparator outputs the first value, the second latch for storing the output of the offset measurer when the comparator outputs the second value, and the adder for adding the output values of the first latch and second latch to arrive at an average value.

The offset measurer may also be a look up table, wherein the look up table is implemented with a flash memory, or a programmable ROM.

The device has the second input of the operational amplifier and the second input of the comparator electrically connected to a common node for receiving an input voltage. The first input of the operational amplifier receives an input voltage to be amplified through at least a portion of the first resistor network.

According to another aspect of the invention, the second input of the operational comparator and the second input of the comparator are commonly connected to ground, or the first input of the operational amplifier is an inverting input terminal.

Preferably, the comparator includes a differential amplifier.

The comparator may be a chopping comparator.

According to another aspect of the invention, a device for nullifying an offset voltage in an operational amplifier is provided, the operational amplifier having a first input, a second input, an output, and a first resistor connected between the output and the first input, the device comprising: an adjustable resistor electrically connected to the first resistor, forming a first resistor network having a first feedback ratio at the first input of the operational amplifier; and an offset control unit electrically connected to the output of the operational amplifier and the adjustable resistor, the offset control unit having a second resistor network with a second feedback ratio for tracking an offset voltage present at the input of the operational amplifier to generate an offset error value, wherein the offset control unit adjusts the adjustable resistor based on the offset error value to nullify the offset voltage.

The offset control unit further comprises: a comparator having a first input and a second input, the first input electrically connected to the output of the operational amplifier through a second resistor; a third resistor connected to the second resistor, forming the second resistor network having the second feedback ratio at the first input of the comparator; and an offset measurer electrically connected between the comparator and the adjustable resistor for measuring an output value of the comparator and for adjusting the adjustable resistor based on the measured output value, wherein the second feedback ratio is the same as the first feedback ratio.

According to still another embodiment of the present invention, a device for nullifying an offset voltage in an operational amplifier is provided, the operational amplifier having a first input, a second input, an output, and a first resistor connected between the output and the first input, the device comprising: a second resistor electrically connected to the first resistor, forming a first resistor network having a first feedback ratio at the first input of the operational amplifier, wherein the first resistor is an adjustable resistor; and an offset control unit electrically connected to the output of the operational amplifier and the adjustable resistor, the offset control unit having a second resistor network with a second feedback ratio for tracking an offset voltage present at the input of the operational amplifier to generate an offset error value, wherein the offset control unit adjusts the adjustable resistor based on the offset error value to nullify the offset voltage.

The offset control unit further comprises: a comparator having a first input and a second input, the first input electrically connected to the output of the operational amplifier through a third resistor; a forth resistor connected to the third resistor, forming the second resistor network having the second feedback ratio at the first input of the comparator; and an offset measurer electrically connected between the comparator and the adjustable resistor for measuring an output value of the comparator and for adjusting the adjustable resistor based on the measured output value, wherein the second feedback ratio is the same as the first feedback ratio.

According to still another embodiment of the present invention, a method of nullifying an offset voltage in an operational amplifier is provided, the operational amplifier having a first input, a second input, an output, and a first resistor connected between the output and the first input, the method comprising: setting an adjustable resistor at an initial value corresponding to zero offset, the adjustable resistor electrically connected to the first resistor, forming a first resistor network having a first feedback ratio at the first input of the operational amplifier; and tracking an offset voltage present at the input of the operational amplifier by using an offset control unit electrically connected to the output of the operational amplifier and the adjustable resistor, the offset control unit having a second resistor network with a second feedback ratio; generating an offset error value; and adjusting the adjustable resistor based on the offset error value to nullify the offset voltage.

The step of tracking an offset voltage may include: comparing by a comparator an input voltage at the operational amplifier with the voltage present at the second resistor network with the second feedback ratio; and measuring an output value of the comparator and adjusting the adjustable resistor based on the measured output value, wherein the second feedback ratio is set to be the same as the first feedback ratio.

The method further may include selectively connecting the second resistor network to the operational amplifier using an enable signal and resetting the adjustable resistor to the initial value when the enable signal is inactive.

The step of measuring may include counting up in value at a counter when the comparator outputs a first logic value and counting down in value when the comparator outputs a second logic value and the step of adjusting the adjustable resistor includes adjustably increasing and decreasing the resistance proportionally to the counter value.

The method further may include averaging the measured values and resetting the adjustable resistor to a value corresponding to zero offset based on the average value, wherein the step of averaging includes storing a first measured value when the comparator outputs a first value and storing a second measured value when the comparator outputs a second value, and adding the first measured values to the second measured values to arrive at an average value.

BRIEF DESCRIPTION OF THE DRAWINGS

The above aspects of the present invention will become more apparent by describing in detail exemplary embodiments thereof with reference to the attached drawings, in which:

FIG. 10 shows a look-up-table storage of resistor adjusting codes.

DETAILED DESCRIPTION OF PREFERRED EMBODIMENTS OF THE INVENTION

Figure 1A:
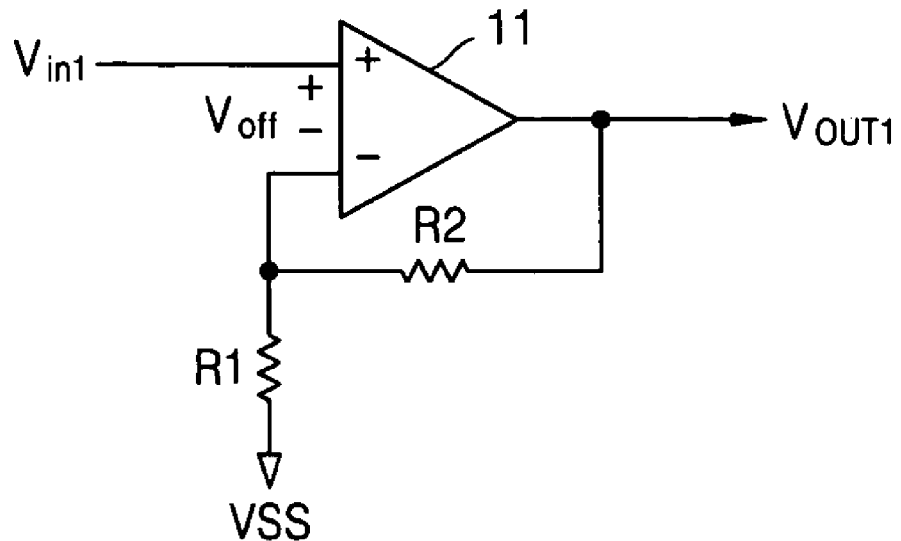
FIG. 1A shows a conventional non-inverting operational amplifier.
Figure 1B:
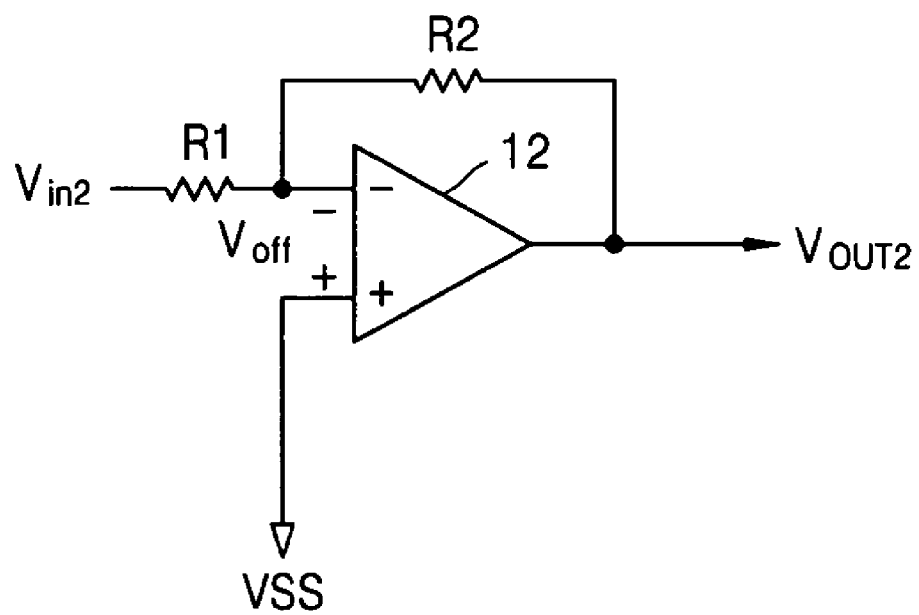
FIG. 1B shows a conventional inverting operational amplifier.
Figure 2:
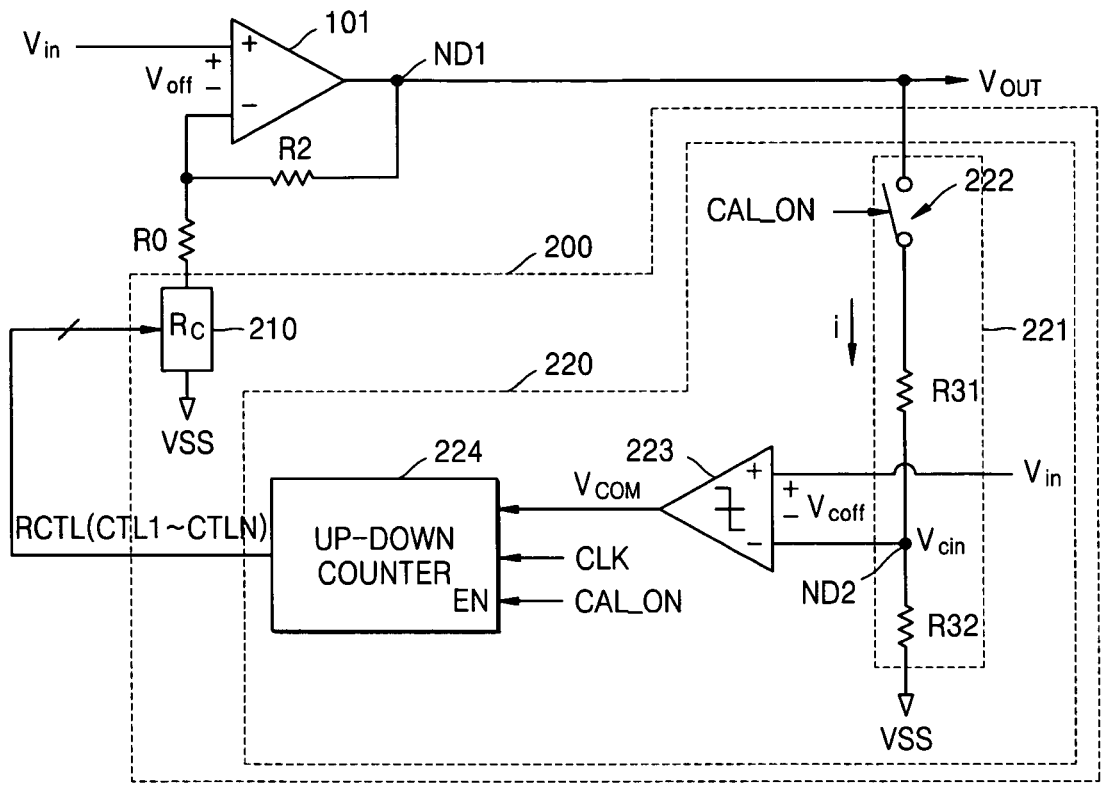
FIG. 2 shows a device for nullifying offset voltage according to an embodiment of the present invention.

Hereinafter, the present invention will be described in detail by describing preferred embodiments thereof with reference to the accompanying drawings. FIG. 2 shows a device for nullifying an offset voltage according to an embodiment of the present invention. An operational amplifier 101 is connected as a non-inverting amplifier having its non-inverting terminal connected to a node for receiving input voltage $V_{IN}$, its output node ND1 is connected to the inverting input via feedback resistor R2. The inverting input terminal of operational amplifier 101 is also connected to a resistor R0 and another resistor RC to a ground voltage $V_{ss}$. The resistor RC is preferably an adjustable resistor which will be further described below. The voltage output of the operational amplifier 101 can be expressed as $V_{OUT}=(R2/(R0+RC)+1)V_{IN}$, assuming that the offset voltage $V_{OFF}$ is zero. When an enable signal CAL_ON is active, a switch 222 is closed to connect to the operational amplifier 101 to an offset measurer 220 and a counter 224 is enable to count in the direction indicated at the output $V_{CON}$ of the comparator 223. For example, when $V_{COM}$ is at a high level, the counter 224 counts up and when $V_{COM}$ is a low level, the counter 224 counts down. The output of the counter 224 indicates the value of the direction of variance of the offset voltage $V_{OFF}$ and $V_{IN}$. The offset voltage $V_{OFF}$ is non-zero, an error voltage will appear at the output of the operational amplifier expressed as $V_{OUT}=(R2/(R0+RC)+1)V_{OFF}$. According to the present embodiment of the invention, an offset control unit 200 is electrically connected to the output of the operational amplifier 101 and the adjustable resistor RC, the offset control unit having a second resistor network with a second feedback ratio for tracking an offset voltage present at the input of the operational amplifier 101 to generate an offset error value, wherein the offset control unit 200 adjusts the adjustable resistor RC based on the offset error value to nullify the offset voltage.

The offset control unit 200 includes an offset measurer 220. The offset measurer 220 includes a comparator 223 having one of its two input terminals connected to a node for receiving the input voltage $V_{IN}$. The other input terminal is connected to a resistance network comprising of a resistor R31 and a resistor R32. The resistor R31 is connected to the resistor R32 and the output of the operational amplifier 101 through a switch 222 and the resistor R32 is connected to a bias voltage, preferably a ground voltage Vss. Preferably, the resistor R31 is equal in resistance value with the resistor R2 and resistor R32 is equal in resistance value with the resistors R0 plus RC. Thus, the resistance ratio as seen at the second input terminal of comparator 223 (node ND2) is the same resistance ratio as seen at the inverting input terminal of operational amplifier 101. In such configuration, the voltage $V_{CIN}$ present at the input of the comparator 223 is a virtual equivalent to the voltage at the inverting input terminal of operational amplifier 101. Thus, if the offset voltage $V_{OFF}$>0V, the voltage at $V_{CIN}$ would be higher than the input voltage $V_{IN}$. The comparator 223 will output a low level at $V_{COM}$. If the offset voltage $V_{OFF}$ at the operation amplifier 101 is less than 0V, the voltage present at $V_{CIN}$ is lower than the input voltage $V_{IN}$ and the comparator will output a high level at $V_{COM}$. If the offset voltage $V_{OFF}$ is zero, $V_{CIN}=V_{IN}$ and the comparator 223 will output neither a low or a high voltage. The switch 222 is controlled by an enable signal CAL_ON for selectively connecting the offset control unit 200 to the operational amplifier 101. A counter 224 is connected to the output of the comparator 223. The counter 224 is preferably an up down counter. It is driven by clock CLK and is enabled by enable signal CAL_ON, which also controls switch 222. The counter 224 is in turn connected at its output RCTL to the adjustable resistor RC for adjusting the resistance based on the output of the counter 224.

When the enable signal CAL_ON is active, the switch 222 is closed to connect the operational amplifier 101 to the offset measurer 220 and the counter 224 is enable to count in the direction indicated at the output $V_{COM}$ of the comparator 223. For example, when $V_{COM}$ is at a high level, the counter 224 counts up and when $V_{COM}$ is at a low level, the counter 224 counts down, and the output of the counter 224 indicates the value and the direction of variance of the offset voltage $V_{OFF}$ from $V_{IN}$.

Prior to the connection of the offset measurer 220 to the operational amplifier 101, the adjustable resistor RC is set at a preset initial value, such as "100000", to correspond to an expected zero offset voltage at $V_{OFF}$. Similarly, the resistor R32 is selected at a resistance value equal to the sum of resistor R0 and adjustable resistor RC when RC is set at the initial value. If the offset voltage $V_{OFF}$ at operational amplifier 101 is non-zero, and the offset measurer 220 is connected to the operational amplifier 101 with the switch 222 closed (CAL_ON enabled), the variation in voltage at the output of amplifier 101 at $V_{OUT}$ will be detected by the resistance network R31 and R32 of the offset measurer 220. The comparator 223 will output a voltage level corresponding to a direction of the voltage offset $V_{OFF}$ present at the operational amplifier 101. The output of the comparator 223 will cause a count in either up or down direction at the counter 224 for a duration of a number of preset clock signals. The counted value output from counter 224 at RCTL is used to adjust resistor RC. The adjustment in adjustable resistor RC will cause the resistance ratio network formed by resistors R2, R0 and RC to change in a direction to oppose the value of the offset voltage $V_{OFF}$ present at the operational amplifier 101, thereby forming a feedback loop to reduce the error voltage present at $V_{OUT}$, the output of the operational amplifier 101.

Figure 3:
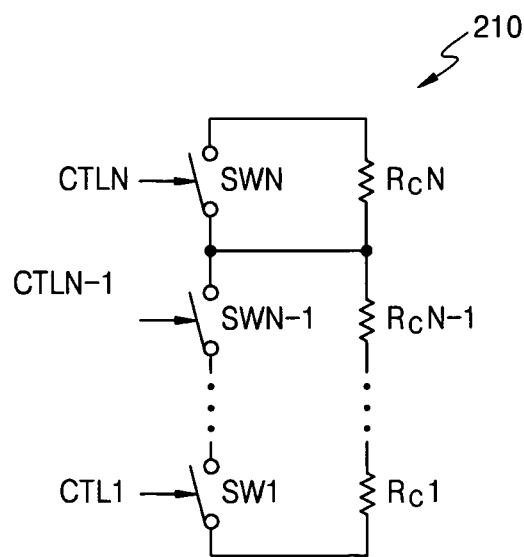
FIG. 3 shows an embodiment of an adjustable resistor.

FIG. 3 shows an adjustable resistor RC according to an embodiment of the present invention. As described above, the adjustable resistor RC receives the count output RCTL from counter 224 and adjusts the resistance value accordingly. According to this embodiment, the plurality of resistors RC1 to RCN are connected in series, and the value of each resistor is either progressively increased or decreased from RC1 to RCN, corresponding with the present count direction of counter 224. The resistance value is adjusted by closing at least one to all of the switches SW1 to SWN. According to this embodiment, the closing of a switch, e.g., SWN removes the resistor RCN from the total resistance value. For example, when the output RCTL output from counter 224 is "011100", SW6, SW2, and SW1 are turned off and SW5, SW4, and SW3 are turned on. As previously described, the initial value of output RCTL of counter 224 is set at "100000", which represents a medium value from which the counter can count down if offset voltage $V_{OFF}$ is greater than $V_{IN}$. In such case, the count value RCTL counts from "100000" to "011111", "011110", and so on. The resistance value of RC is increased, causing the gain of the operational amplifier, represented by (R2/(R0+RC)+1), to decrease, thereby reducing the error voltage at $V_{OUT}$ caused by the offset voltage $V_{OFF}$.

Figure 4A:
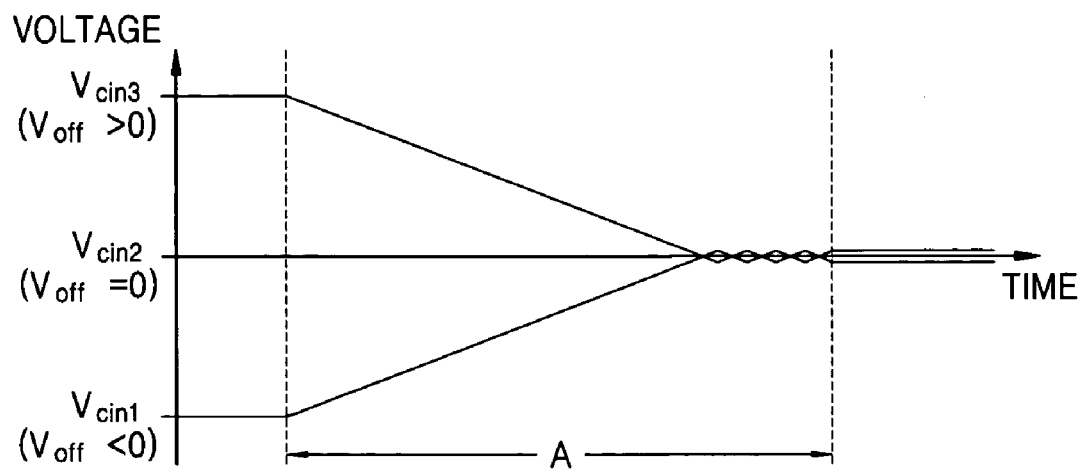
FIGS. 4A and 4B show graphs of offset voltages and nullification of same.
Figure 4B:
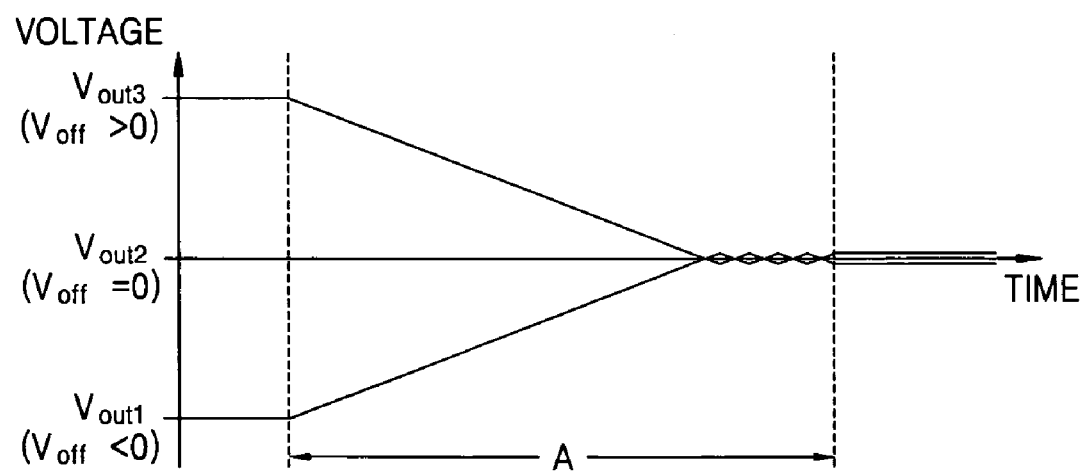

FIGS. 4A and 4B are graphs showing the variations of the voltage present at the $V_{CIN}$ input of the comparator 224 and the voltage output at $V_{OUT}$ of the operational amplifier 101, respectively, for the different offset voltages at $V_{OFF}$. As can be seen, the offset voltage is nullified or reduced to zero with the operation of the device of FIG. 2 within time A.

Figure 5:
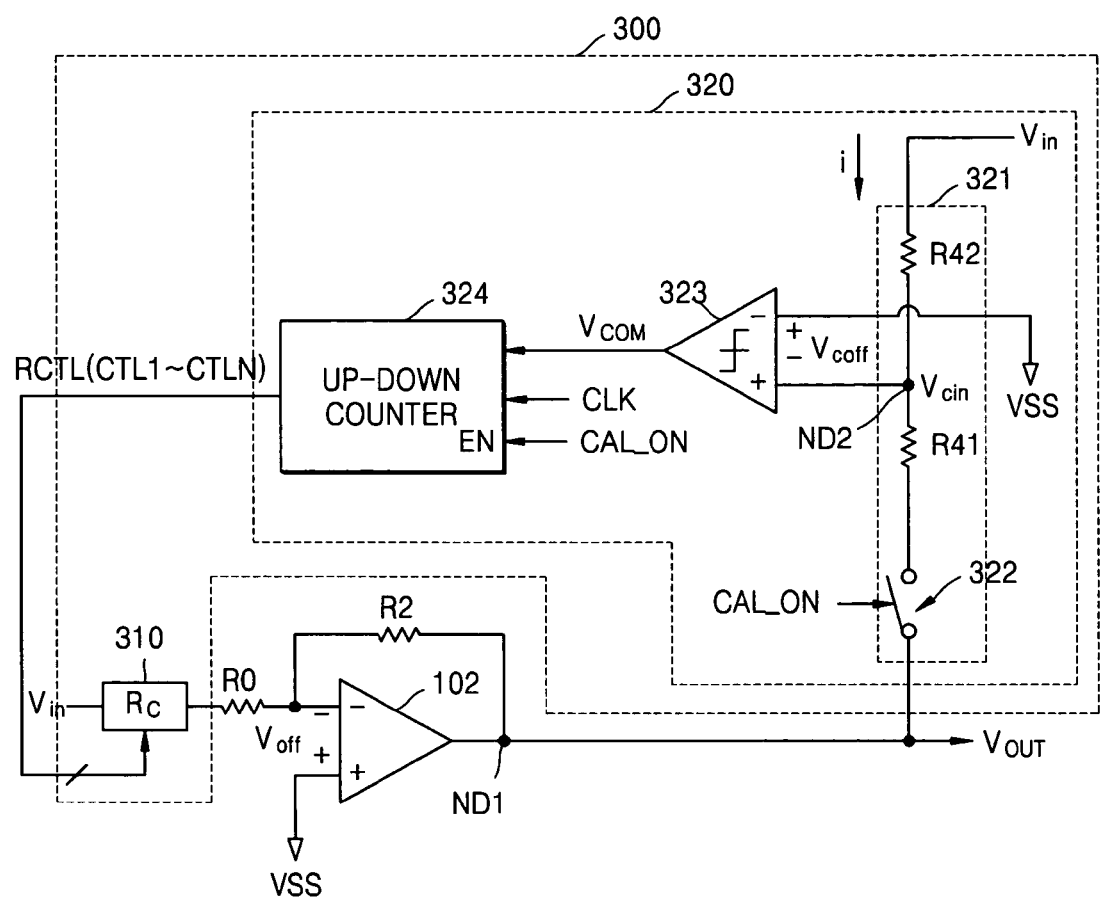
FIG. 5 shows a device for nullifying offset voltage according to another embodiment of the present invention.

FIG. 5 shows another device for nullifying offset voltage according to another embodiment of the present invention. An operational amplifier 102 is connected as an inverting amplifier with its non-inverting input connected to ground voltage VSS and its output node ND1 connected through a feedback resistor R2. A resistor network formed by resistor R2, resistor R0 and adjustable resistor RC is connected to input voltage $V_{IN}$. The operational amplifier 102 operates in an inverting mode with a resistance network ratio R2/(R0+RC) and a gain of $-R2(R0+RC)$. The output node ND1 of the operational amplifier 102 is connected to an offset measurer 320 through a switch 322 and a resistor network formed by resistors R41 and R42, which in turn is connected to an input voltage node $V_{IN}$. The resistor network in the offset measurer 320 is connected to one of two input terminals of comparator 323. The resistors R41 and R42 are set at values which form a ratio R41/R42 at node ND2 or the input of comparative 323 to be the same as the ratio R2/(R0+RC) of the resistor network present at the inverting input terminal of the operational amplifier 102. A second input of the comparator 323 is connected to VSS. The output of the comparator 323 is connected to a counter 324 to measure the extent of offset from an initial value output at the output $V_{OUT}$ of the operational amplifier 102. The counter 324 will count corresponding to the extent of variation measured by the comparator 323, thereby measuring the offset from the output of operational amplifier 102. The output of counter 324 at RCTL is used to adjust the resistance of adjustable resistor RC 310. Both switch 322 and counter 324 are enabled by an enable signal CAL_ON. Preferably, when switch 322 is open and counter 324 is enabled, the adjustable resistance RC is set at an initial value, preferably 100000. The device of FIG. 5 operates to nullify the offset voltage $V_{OFF}$ that is present at the input of the operational amplifier 102 essentially as described for the device of FIG. 2, except the direction of the counter 324 may be reversed.

Figure 6:
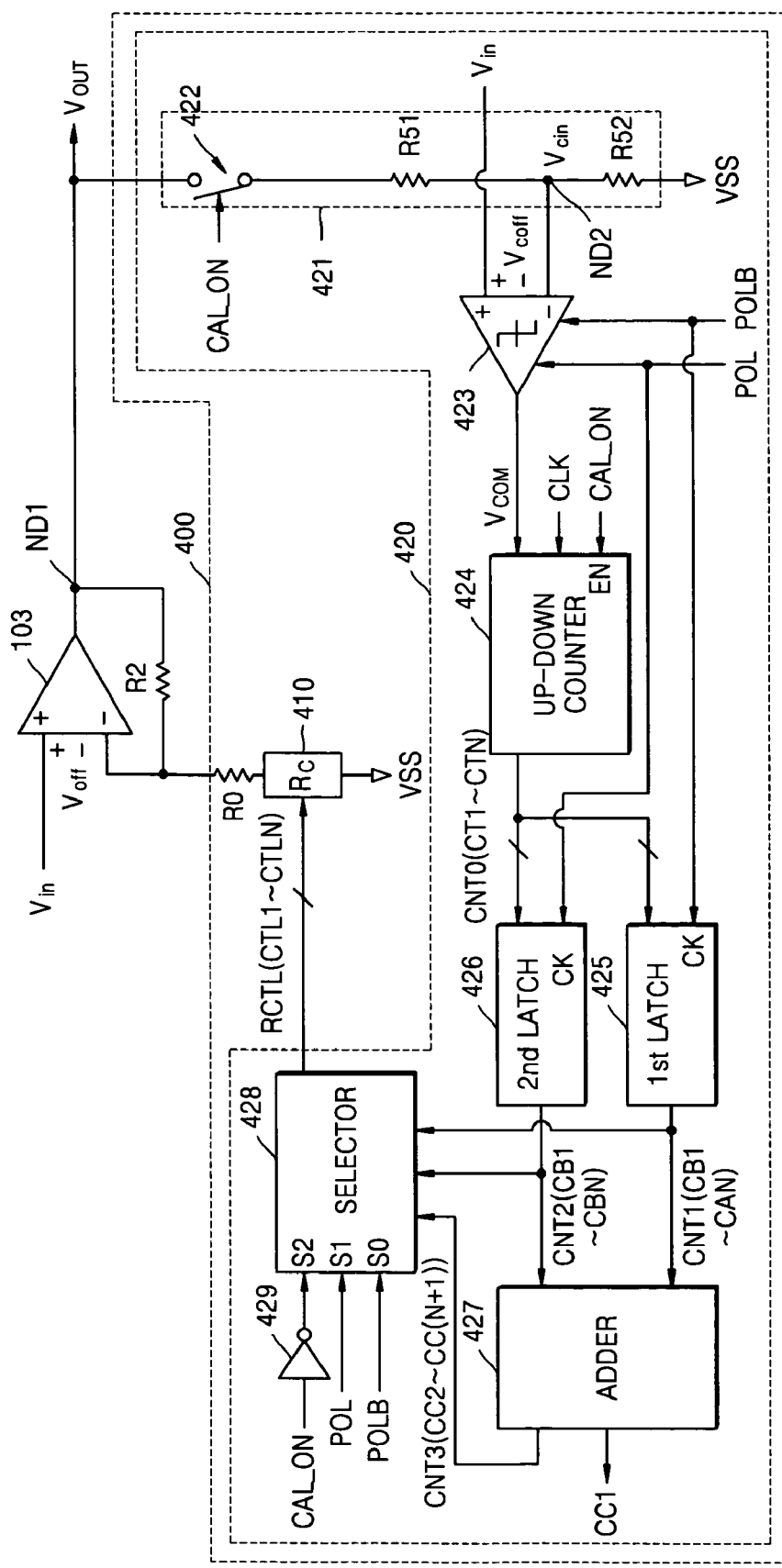
FIG. 6 shows a device for nullifying offset voltage according to still another embodiment of the present invention.
Figure 7:
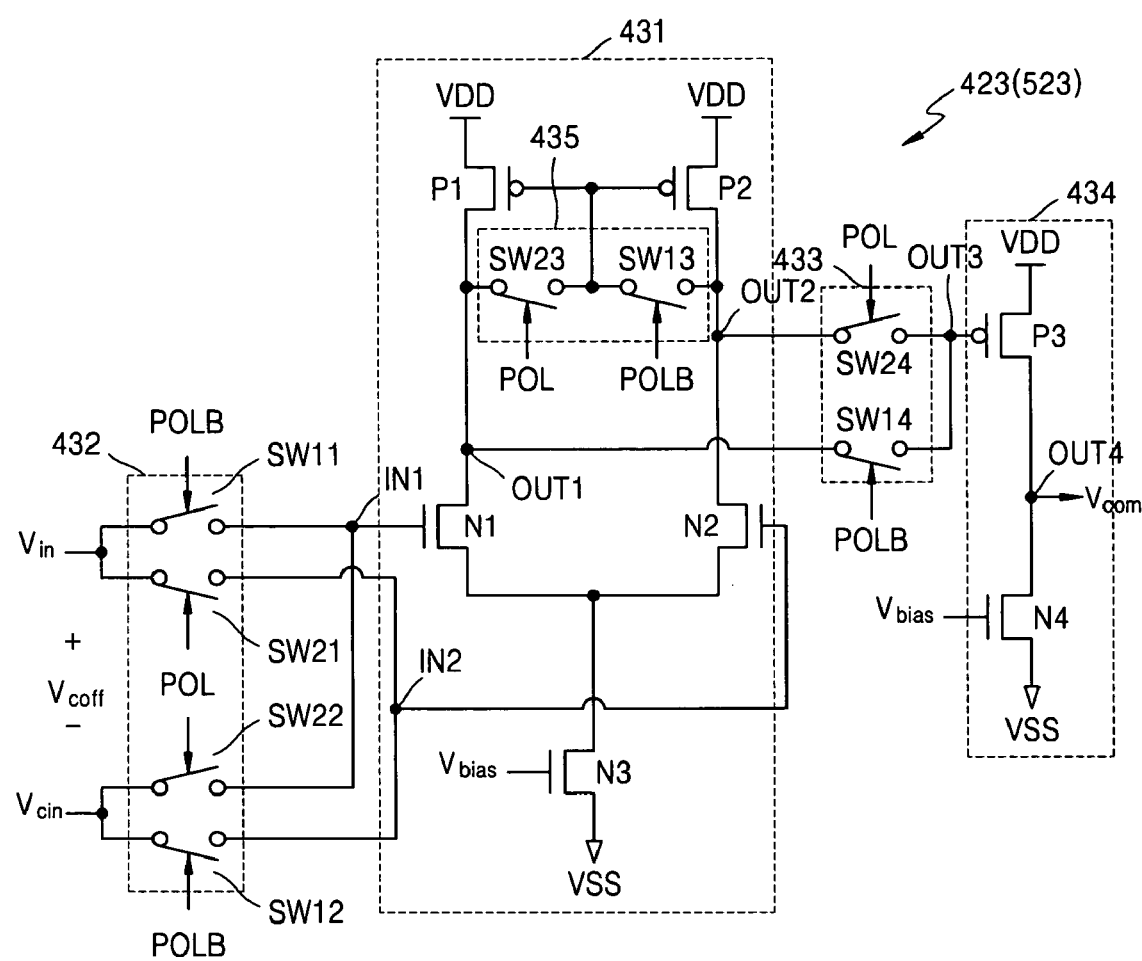
FIG. 7 shows a schematic diagram of the comparator of FIG. 6.

FIG. 6 shows a device for nullifying offset voltages in amplifiers according to still another embodiment of the present invention. An operational amplifier 103 has its non-inverting input connected to voltage input terminal VIN and its inverting input terminal connected to its output ND1 through feedback resistor R2. The inverting input terminal is also connected to resistor R0 and adjustable resistor RC to ground voltage node VSS. The output of the operational amplifier 103 at node ND1 is connected to an offset measurer 420 through switch 422 to a resistor network formed by resistors R51 and R52 to the ground node VSS. A comparator 423 and a counter 424 is connected essentially as described in FIG. 2 for measuring an offset voltage which may be present at the operational amplifier 103. According to the present embodiment, the offset measurer 420 includes further circuitry for compensating an offset voltage which may be present at the comparator 423. The comparator 423 is preferably a chopping comparator, a more detail circuit diagram of which is shown in FIG. 7. The comparator 423 includes a differential amplifier 431, a first switching unit 432, and second switching unit 433, and an output unit 434. The operations of a chopping amplifier including a differential amplifier and the switching units are known to one ordinary skilled in the art. The switches in the switching units are controlled by signals POL and POLB with POL and POLB being inverted from one another in polarity. The signals POL and POLB thus operate to alternate the application of the inputs $V_{IN}$ and $V_{CIN}$ of the comparator 423 to the two input terminals of differential amplifier 431. For example, when POL is low, POLB is high, switches SW11 to SW14 are turned on, and switches SW21 to SW24 are turned off.

Referring again to FIG. 6, the offset measurer 420 includes a first latch 425 and a second latch 426, both of which are connected to receive the output CNT0 of counter 424. The first latch is connected at a clock terminal to switch signal POLB and a second latch 426 is connected to switch signal POL. Thus, when comparator 423 is operated with POL active, the second latch 426 latches the counter output CNT0 of counter 424. Likewise, the first latch 425 latches the output from counter 424 when the comparator 423 operates when POLB is active. The first latch 425 and second latch 426 are in turn connected to an adder 427. The adder 427 is used to accumulate the values latched at the first latch 425 and the second latch 426. The accumulated value is the average value output from comparator 423. The output of the adder 427 is in turn connected to a selector 428. The selector 428 is provided with the output of first latch 425, the second latch 426, and the adder 427. One of the three outputs received by the selector 428 is selectively output by activating one of inputs POL, POLB, and CAL_ON. Thus, an adjustable resistor RC can be adjusted by any one of the average value, the offset measured output when POL is active, or when the offset measured value when POLB is active. Selection of the average value from the adder 427 nullifies an offset voltage $V_{COFF}$ that is present at the input of the comparator 423.

Figure 8:
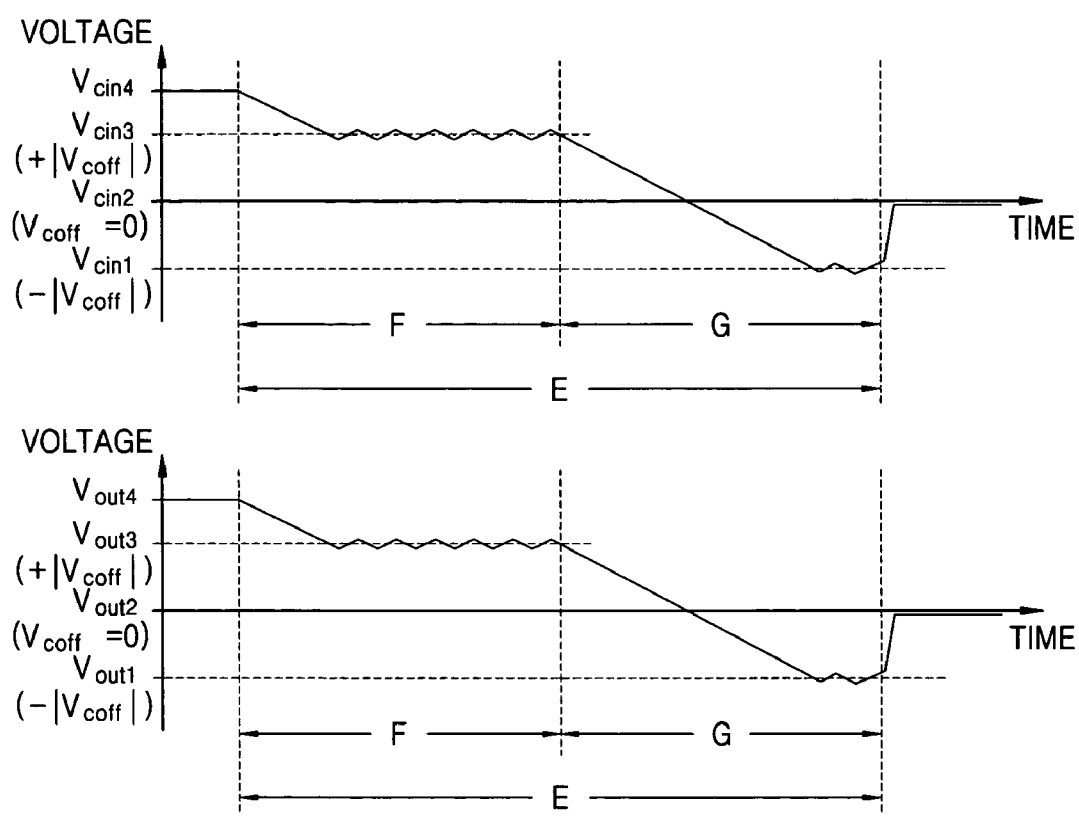
FIG. 8 shows a timing waveform of the signals in the circuit of FIG. 6.

FIG. 8 shows a timing waveform of the input and output signals of the comparator 423 with application of control signals POL and POLB. For example, during time F, POL is low and POLB is high, causing SW11 to SW14 to close and SW21 to SW24 to open. It can be seen that a positive offset voltage $V_{COFF}$ present at the comparator is gradually decreased. During time G, POL is switched to high and POLB is low, causing SW11 to SW14 to open and SW21 to SW24 to close, alternating the inputs $V_{CIN}$ and $V_{IN}$ applied to the inputs of the differential amplifier 431. The error component of input voltage $V_{CIN}$ and output voltage $V_{COM}$ of the comparator 423 switches in polarity and is gradually nullified.

Figure 9:
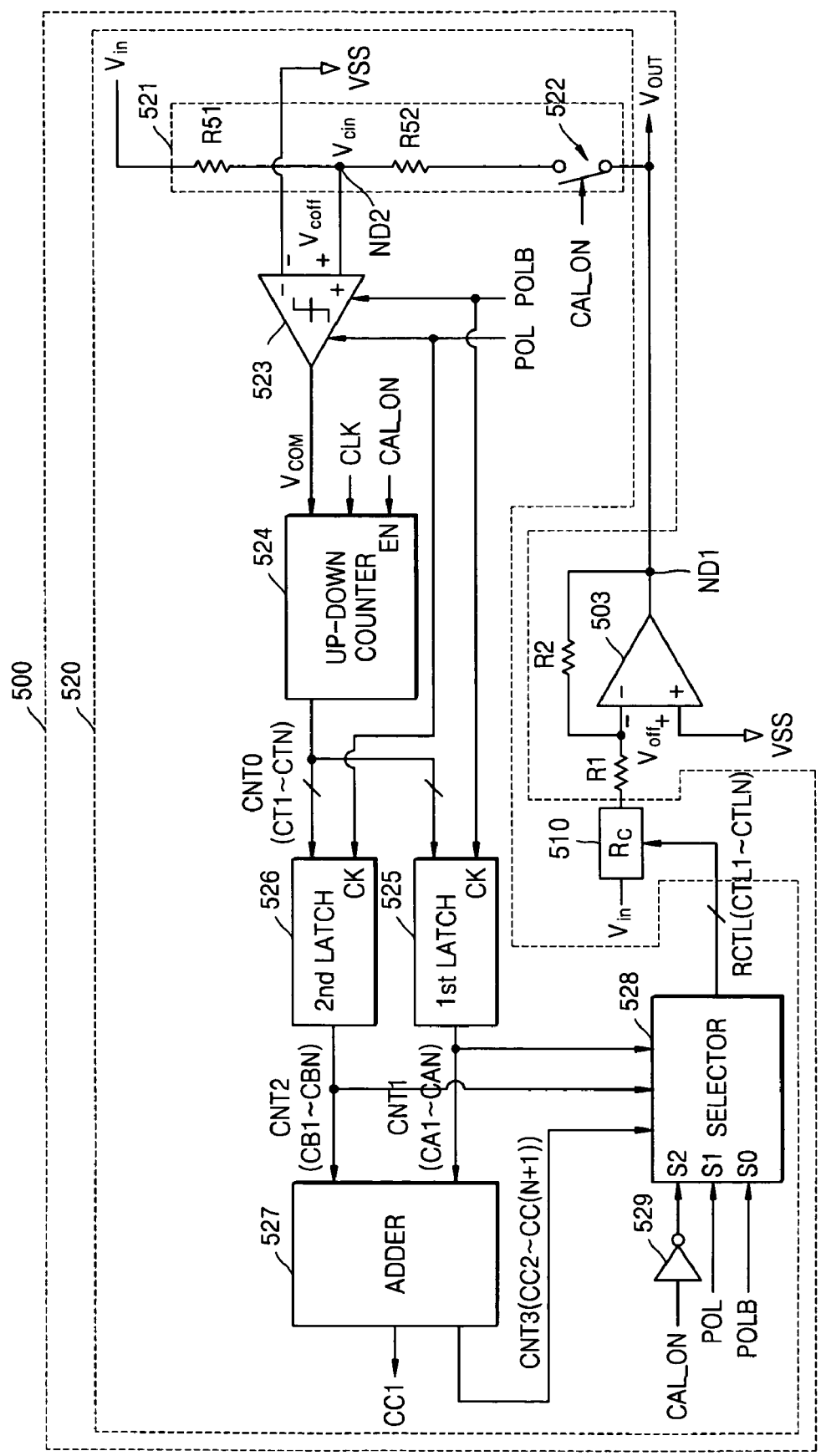
FIG. 9 shows a device for nullifying offset voltage according to still another embodiment of the present invention.

FIG. 9 shows a device for nullifying offset voltage according to still another embodiment of the present invention. An operational amplifier 503 has its non-inverting input connected to a ground terminal Vss and its inverting input terminal connected to its output ND1 through feedback resistor R2. The inverting input terminal is also connected to resistor R1 and adjustable resistor RC to an input voltage node $V_{IN}$. The output of the operational amplifier 503 at node ND1 is connected to an offset measurer 520 through a switch 522 to a resistor network formed by resistors R51 and R52 to the input voltage node $V_{IN}$. A comparator 523 and a counter 524 is connected essentially as described in FIG. 6 for measuring an offset voltage which may be present at operational amplifier 503. According to the present embodiment, the offset measurer 520 includes further circuitry for compensating an offset voltage which may be present at the comparator 523. The comparator 523 is preferably a chopping comparator, a more detail circuit diagram of which is shown in FIG. 7 and described above.

The offset measurer 520 includes a first latch 525 and a second latch 526, both of which are connected to receive the output CNT0 of counter 524. The first latch is connected at a clock terminal to switch signal POLB and a second latch 526 is connected to switch signal POL. Thus, when comparator 523 is operated with POL active, the second latch 526 latches the counter output CNTO of counter 524. Likewise, the first latch 525 latches the output from counter 524 when the comparator 523 operates when is active. The first latch 525 and second latch 526 are in turn connected to adder 527. The adder 527 is used to accumulate the values latched at the first latch 525 and the second latch 526. The accumulated value is the average value output from comparator 523. The output of the adder 527 is in turn connected to selector 528. Selector 528 is provided with the output of first latch 525, the second latch 526, and the adder 527. One of the three outputs received by the selector 528 is selectively output by activating one of inputs POL, POLB, and CAL_ON. Thus, adjustable resistor RC can be adjusted by any one of the average value, the offset measured output when POL is active, or when the offset measured value when POLB is active. Selection of the average value from adder 527 nullifies an offset voltage $V_{COFF}$ that is present at the input of the comparator 523.

One ordinary skilled in the art can readily appreciate that although the above embodiments are explained with specific exemplary circuitry, other equivalent circuits can be used to nullify offset voltages. For example, the functions of the counter used in the offset measurer according to the plural embodiments may be replaced by use of a lookup table (LUT). FIG. 10 shows an exemplary table of data stored in the LUT. As shown, a pointer points at an initial location having a value "00001111". Depending on the output of the comparator (e.g., 523 of FIG. 9) the pointer is moved up if comparator output $V_{COM}$ is a low level and moves down if VCOM is a high level. The pointer moves up or down incrementally on each clock cycle of CLK. The LUT outputs the data RCTL to the adjustable resistor RC for adjusting the resistance value similar to that as described for the counter above. Preferably, the LUT is implemented in flash memory or programmable ROM. In another example, the resistor network connected to the operational amplifier is described for the above embodiments as comprising three resistors, e.g. R2, R0 and RC. It is apparent to one ordinary skilled that the two resistors (R0 and RC) other than the feedback resistor R2 can be replaced by a single adjustable resistor without affecting the operation of the described devices.

Preferred embodiments of the present invention have been disclosed herein and, although specific terms are employed, they are used and are to be interpreted in a generic and descriptive sense only and not for the purpose of limitation. Accordingly, it will be understood by those of ordinary skill in the pertinent art that various changes in form and details may be made without departing from the spirit and scope of the present invention as set forth in the following claims.

The invention claimed is:

1. A device for nullifying an offset voltage in an operational amplifier, the operational amplifier having a first input, a second input, an output, and a first resistor connected between the output and the first input, the device comprising:
    an adjustable resistor electrically connected to the first resistor, forming a first resistor network having a first feedback ratio at the first input of the operational amplifier;
    a comparator having a first input and a second input, the first input electrically connected to the output of the operational amplifier through a second resistor;
    a third resistor connected to the second resistor, forming a second resistor network having a second feedback ratio at the first input of the comparator; and
    an offset measurer electrically connected to the comparator and the adjustable resistor for measuring an output value of the comparator and for adjusting the adjustable resistor based on the measured output value.

2. The device of claim 1, wherein the first feedback ratio and the second feedback ratio are the same.

3. The device of claim 1, further including an enable signal node for receiving an enable signal for selectively connecting the second resistor network to the operational amplifier and enabling the offset measurer.

4. The device of claim 3, wherein the adjustable resistor is set at an initial value corresponding to a zero offset voltage when the enable signal is inactive.

5. The device of claim 1, wherein the offset measurer is a counter.

6. The device of claim 5, wherein the counter counts up in value when the comparator outputs a first logic value and counts down in value when the comparator outputs a second logic value and the adjustable resistor is adjustably increased or decreased proportionally to the counter value.

7. The device of claim 1, further including an averaging circuit for averaging the values output from the offset measurer, wherein the output of the averaging circuit is used to adjust the adjustable resistor to a value corresponding to zero offset.

8. The device of claim 7, wherein the averaging circuit includes a first latch, a second latch, and an adder, the first latch for storing the output of the offset measurer when the comparator outputs the first value, the second latch for storing the output of the offset measurer when the comparator outputs the second value, and the adder for adding the output values of the first latch and second latch to arrive at an average value.

9. The device of claim 1, wherein the offset measurer is a look up table.

10. The device of claim 9, wherein the look up table is implemented with a flash memory.

11. The device of claim 9, wherein the look up table is implemented with a programmable ROM.

12. The device of claim 1, wherein the second input of the operational amplifier and the second input of the comparator is electrically connected to a common node for receiving an input voltage.

13. The device of claim 1, wherein the first input of the operational amplifier receives an input voltage to be amplified through at least a portion of the first resistor network.

14. The device of claim 13, wherein the second input of the operational comparator and the second input of the comparator are commonly connected to ground.

15. The device of claim 1, wherein the comparator includes a differential amplifier.

16. The device of claim 1, wherein the comparator is a chopping comparator.

17. The device of claim 1, wherein the first input of the operational amplifier is an inverting input terminal.

18. A device for nullifying an offset voltage in an operational amplifier, the operational amplifier having a first input, a second input, an output, and a first resistor connected between the output and the first input, the device comprising:
    an adjustable resistor electrically connected to the first resistor, forming a first resistor network having a first feedback ratio at the first input of the operational amplifier; and
    an offset control unit electrically connected to the output of the operational amplifier and the adjustable resistor, the offset control unit having a second resistor network with a second feedback ratio for tracking an offset voltage present at the input of the operational amplifier to generate an offset error value, wherein the offset control unit adjusts the adjustable resistor based on the offset error value to nullify the offset voltage.

19. The device of claim 18, wherein the offset control unit further comprises:
    a comparator having a first input and a second input, the first input electrically connected to the output of the operational amplifier through a second resistor;
    a third resistor connected to the second resistor, forming the second resistor network having the second feedback ratio at the first input of the comparator; and
    an offset measurer electrically connected between the comparator and the adjustable resistor for measuring an output value of the comparator and for adjusting the adjustable resistor based on the measured output value.

20. The device of claim 18, wherein the second feedback ratio is the same as the first feedback ratio.

21. The device of claim 18, further including an enable signal node for receiving an enable signal for selectively connecting the second resistor network to the operational amplifier and enabling the offset measurer.

22. The device of claim 18, wherein the offset measurer is a counter.

23. The device of claim 22, wherein the counter counts up in value when the comparator outputs a first logic value and counts down in value when the comparator outputs a second logic value and the adjustable resistor is adjustably increased or decreased proportionally to the counter value.

24. The device of claim 19, further including an averaging circuit for averaging the values output from the offset measurer, wherein the output of the averaging circuit is used to adjust the adjustable resistor to a value corresponding to zero offset.

25. The device of claim 19, wherein the offset measurer is a look up table.

26. The device of claim 20, wherein the look up table is implemented with a flash memory.

27. The device of claim 20, wherein the look up table is implemented with a programmable ROM.

28. The device of claim 19, wherein the comparator includes a differential amplifier.

29. The device of claim 19, wherein the comparator is a chopping comparator.

30. A device for nullifying an offset voltage in an operational amplifier, the operational amplifier having a first input, a second input, an output, and a first resistor connected between the output and the first input, the device comprising:
a second resistor electrically connected to the first resistor, forming a first resistor network having a first feedback ratio at the first input of the operational amplifier, wherein an adjustable resistor is connected to the first resistor; and
an offset control unit electrically connected to the output of the operational amplifier and the adjustable resistor, the offset control unit having a second resistor network with a second feedback ratio for tracking an offset voltage present at the input of the operational amplifier to generate an offset error value, wherein the offset control unit adjusts the adjustable resistor based on the offset error value to nullify the offset voltage.

31. The device of claim 30, wherein the offset control unit further comprises:
a comparator having a first input and a second input, the first input electrically connected to the output of the operational amplifier through a third resistor;
a forth resistor connected to the third resistor, forming the second resistor network having the second feedback ratio at the first input of the comparator; and
an offset measurer electrically connected between the comparator and the adjustable resistor for measuring an output value of the comparator and for adjusting the adjustable resistor based on the measured output value.

32. The device of claim 30, wherein the second feedback ratio is the same as the first feedback ratio.

33. A method of nullifying an offset voltage in an operational amplifier, the operational amplifier having a first input, a second input, an output, and a first resistor connected between the output and the first input, the method comprising:
setting an adjustable resistor at an initial value corresponding to zero offset, the adjustable resistor electrically connected to the first resistor, forming a first resistor network having a first feedback ratio at the first input of the operational amplifier; and
tracking an offset voltage present at the input of the operational amplifier by using an offset control unit electrically connected to the output of the operational amplifier and the adjustable resistor, the offset control unit having a second resistor network with a second feedback ratio;
generating an offset error value; and
adjusting the adjustable resistor based on the offset error value to nullify the offset voltage.

34. The method of claim 33, wherein the step of tracking an offset voltage includes:
comparing by a comparator an input voltage at the operational amplifier with the voltage present at the second resistor network with the second feedback ratio; and
measuring an output value of the comparator and adjusting the adjustable resistor based on the measured output value.

35. The method of claim 33, wherein the second feedback ratio is set to be the same as the first feedback ratio.

36. The method of claim 33, further including selectively connecting the second resistor network to the operational amplifier using an enable signal and resetting the adjustable resistor to the initial value when the enable signal is inactive.

37. The method of claim 34, wherein the step of measuring includes counting up in value at a counter when the comparator outputs a first logic value and counting down in value when the comparator outputs a second logic value and the step of adjusting the adjustable resistor includes adjustably increasing and decreasing the resistance proportionally to the counter value.

38. The method of claim 34, further including averaging the measured values and resetting the adjustable resistor to a value corresponding to zero offset based on the average value.

39. The method of claim 38, wherein the step of averaging includes storing a first measured value when the comparator outputs a first value and storing a second measured value when the comparator outputs a second value, and adding the first measured values to the second measured values to arrive at an average value.

* * * * *